(12) United States Patent
Leigh et al.

(10) Patent No.: US 8,460,947 B2
(45) Date of Patent: Jun. 11, 2013

(54) FLUID EJECTION DEVICE AND METHOD

(75) Inventors: Stan E Leigh, Corvallis, OR (US); Kevin Bruce, Vancouver, WA (US); Joseph M Torgerson, Philomath, OR (US); Trudy Benjamin, Portland, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 417 days.

(21) Appl. No.: 12/880,597

(22) Filed: Sep. 13, 2010

(65) Prior Publication Data

US 2012/0064644 A1    Mar. 15, 2012

Related U.S. Application Data

(62) Division of application No. 12/237,165, filed on Sep. 24, 2008, now Pat. No. 7,815,287.

(51) Int. Cl.
*H01L 21/66* (2006.01)
*G01R 31/26* (2006.01)

(52) U.S. Cl.
USPC .......... 438/17; 438/21; 257/E21.521

(58) Field of Classification Search
USPC ............... 438/17, 21; 257/E21.521
See application file for complete search history.

(56) References Cited

U.S. PATENT DOCUMENTS

| | | | |
|---|---|---|---|
| 5,179,536 A * | 1/1993 | Kasa et al. ............... 365/200 |
| 5,274,778 A * | 12/1993 | Hall .................... 365/185.21 |
| 5,289,210 A | 2/1994 | Takayanagi |
| 5,396,499 A * | 3/1995 | Urai .................... 714/718 |
| 5,416,738 A | 5/1995 | Shrivastava |
| 5,502,468 A | 3/1996 | Knierim |
| 5,568,426 A * | 10/1996 | Roohparvar et al. .... 365/185.22 |
| 5,574,857 A * | 11/1996 | Ramakrishnan et al. ....... 714/54 |
| 5,604,526 A | 2/1997 | Kwak |
| 5,677,879 A * | 10/1997 | Roohparvar et al. .... 365/185.22 |
| 5,729,494 A * | 3/1998 | Gotou et al. ............. 365/185.24 |
| 5,732,013 A * | 3/1998 | Von Basse et al. ............ 365/104 |
| 5,740,349 A * | 4/1998 | Hasbun et al. ............... 714/6.13 |
| 5,748,530 A * | 5/1998 | Gotou et al. ............. 365/185.18 |
| 5,748,872 A * | 5/1998 | Norman .................... 714/11 |
| 5,761,125 A * | 6/1998 | Himeno .................. 365/185.24 |
| 5,764,569 A * | 6/1998 | Wright .................... 365/185.09 |
| 5,859,796 A * | 1/1999 | Cleveland ................. 365/185.2 |
| 5,963,462 A * | 10/1999 | Engh et al. ...................... 365/45 |
| 6,325,483 B1 | 12/2001 | Harbour et al. |
| 6,389,366 B1 * | 5/2002 | Heavlin ..................... 702/84 |
| 6,490,203 B1 * | 12/2002 | Tang .................. 365/185.22 |
| 6,543,882 B2 | 4/2003 | Axtell et al. |
| 6,551,846 B1 * | 4/2003 | Furutani et al. ................ 438/17 |
| 6,558,967 B1 * | 5/2003 | Wong ............................. 438/17 |
| 6,781,883 B1 * | 8/2004 | Madurawe et al. ....... 365/185.21 |
| 6,822,913 B2 * | 11/2004 | Pochmuller .................... 365/201 |
| 6,855,568 B2 * | 2/2005 | Weiner et al. ................... 438/17 |
| 6,869,157 B2 | 3/2005 | Miyakoshi et al. |
| 6,900,459 B2 * | 5/2005 | Farnworth et al. .............. 257/48 |
| 6,958,249 B1 * | 10/2005 | Tzeng et al. .................... 438/18 |
| 7,180,795 B1 * | 2/2007 | Chan et al. ............... 365/189.09 |

(Continued)

*Primary Examiner* — Mary Wilczewski (57) ABSTRACT

A fluid ejection device includes one or more digital data storage arrays having plural EPROM cells. A method for affirming performance adequacy of EPROM cells in the one or more arrays includes the steps of identifying a reference cell in each array, measuring a selected performance criterion for the reference cells, obtaining a reference criterion value, and evaluating the actual performance of at least one cell in each array with respect to the reference criterion value.

10 Claims, 4 Drawing Sheets

U.S. PATENT DOCUMENTS

| | | |
|---|---|---|
| 7,365,387 B2 | 4/2008 | Benjamin |
| 7,815,287 B2 * | 10/2010 | Leigh et al. .................. 347/49 |
| 2002/0176281 A1 * | 11/2002 | Tang .................. 365/185.22 |
| 2007/0132005 A1 | 6/2007 | Kim et al. |
| 2010/0076727 A1 * | 3/2010 | Leigh et al. .................. 702/182 |
| 2012/0064644 A1 * | 3/2012 | Leigh et al. .................. 438/17 |

* cited by examiner

FLUID EJECTION DEVICE AND METHOD

RELATED APPLICATIONS

This application is a Divisional of U.S. patent application Ser. No. 12/237,165 filed Sep. 24, 2008, which is U.S. Pat. No. 7,815,287, issued Oct. 19, 2010.

BACKGROUND

Inkjet printing systems are a type of fluid ejection device. Such systems generally include an inkjet die, which comprises a silicon semiconductor substrate having one or more arrays of firing nozzles (e.g. heater resistors) fabricated thereon, along with circuitry for addressing the nozzles. Such systems can also include an array of Electrically Programmable Read-Only Memory (EPROM) cells on the die. Such fluid ejection devices can be used to eject ink, such as in printing systems, or other fluids.

It is generally desirable to reduce the total physical area and/or width of an inkjet die with EPROM cells. In doing so, the placement and geometry of the EPROM array(s) can be adjusted. Nonetheless, performance characteristics vary among EPROM cells that have been fabricated on a single semiconductor die, and the performance variations of these cells can increase with the physical distance between the cells. Consequently, when multiple EPROM arrays are separated by some distance on an inkjet die, more of the dies can fail to meet established performance standards, and thus be discarded. This results in lower device yield and, hence, increases fabrication costs and time.

BRIEF DESCRIPTION OF THE DRAWINGS

Various features and advantages of the present disclosure will be apparent from the detailed description which follows, taken in conjunction with the accompanying drawings, which together illustrate, by way of example, features of the present disclosure, and wherein.

DETAILED DESCRIPTION

Reference will now be made to exemplary embodiments illustrated in the drawings, and specific language will be used herein to describe the same. It will nevertheless be understood that no limitation of the scope of the present disclosure is thereby intended. Alterations and further modifications of the features illustrated herein, and additional applications of the principles illustrated herein, which would occur to one skilled in the relevant art and having possession of this disclosure, are to be considered within the scope of this disclosure.

As used herein, directional terms, such as "top," "bottom," "front," "back," "leading," "trailing," etc, are used with reference to the orientation of the figures being described. Because components of various embodiments disclosed herein can be positioned in a number of different orientations, the directional terminology is used for illustrative purposes only, and is not intended to be limiting.

As used herein, the term "fluid ejection device" is intended to refer generally to any drop-on-demand fluid ejection system, and the terms "printhead" and "printer" are intended to refer to the same type of system. It is to be understood that where the description presented herein depicts or discusses an embodiment of an ink jet printing system, this is only one embodiment of a drop-on-demand fluid ejection system that can be configured in accordance with the present disclosure.

Where this disclosure refers to "ink", that term is to be understood as just one example of a fluid that can be ejected from a drop-on-demand fluid ejection device in accordance with this disclosure. Many different kinds of liquid fluids can be ejected from drop-on-demand fluid ejection systems, such as food products, chemicals, pharmaceutical compounds, fuels, etc. The term "ink" is therefore not intended to limit the system to ink, but is only exemplary of a liquid that can be used. Additionally, the terms "print" or "printing" and "ink jet" are intended to generally refer to fluid ejection onto any substrate for any purpose, and are not limited to providing visible images on paper or the like.

As used herein, the term "cell" refers to the physical structure of an EPROM or other semiconductor memory element, and is intended to encompass all parts of a single memory element, including the source, drain, control gate, floating gate, etc. The term "bit" is used to refer to data (i.e. a logic-1 or a logic-0) that can be stored in a cell in the form of an analog voltage that thereby establishes a corresponding data state for the semiconductor memory element of the cell.

Figure 1A:
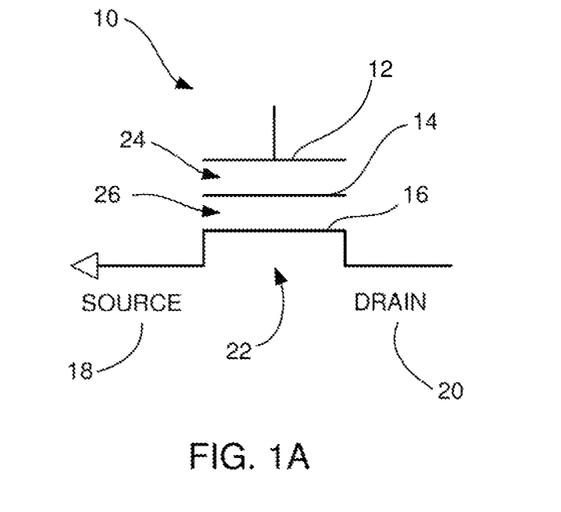
FIG. 1A is a schematic diagram of an EPROM cell.
Figure 1B:
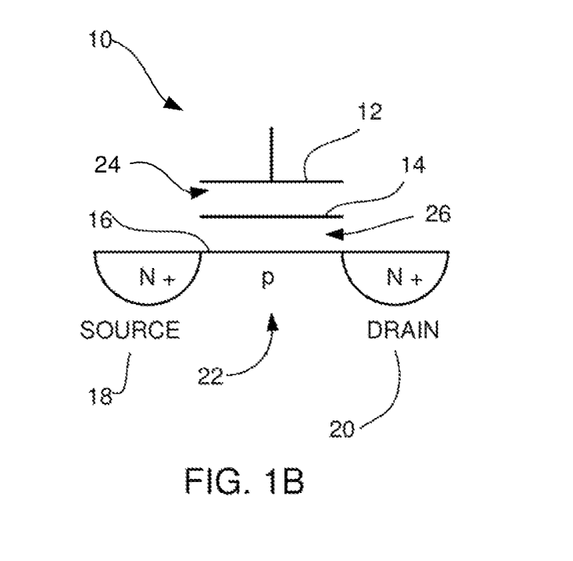
FIG. 1B is an alternative schematic diagram of an EPROM cell.

Electronically programmable read-only memory, or EPROM cells have been used in ink jet printheads and other applications. EPROM cells do not include fuses, and are believed to provide a number of advantages over some other types of memory cells in certain circumstances. Two different schematic diagrams of an EPROM cell 10 are shown in FIGS. 1A and 1B. An EPROM cell generally includes an input gate 12 (also called a control gate), a floating gate 14, and a semiconductor substrate 16 that includes a source 18 and a drain 20. As shown in FIG. 1B, the semiconductor material is provided with N+ doped regions that create the source and drain, respectively, and a p doped region 22 therebetween. The control gate and floating gate are capacitively coupled together, with a dielectric material 24 therebetween, such that the control gate voltage is coupled to the floating gate. Another layer of dielectric material 26 is disposed between the floating gate 14 and the semiconductor substrate 16.

A high voltage bias on the drain 20 generates energetic "hot" electrons. A positive voltage bias between the control gate 12 and the drain pulls some of these hot electrons onto the floating gate 14. As electrons are pulled onto the floating gate, the threshold voltage of the cell, that is, the voltage that causes the gate/drain to conduct current, increases. If sufficient electrons are pulled onto the floating gate, those electrons will block current flow, such that the threshold voltage will eventually increase to a level above a desired threshold voltage (e.g. the operating voltage of the circuit). This will cause the cell to block current at that voltage level, which changes the data state of the cell from a logic-1 to a logic-0, or visa versa depending on the logic conventions employed in the system in which the cell is employed. After programming of the cell, a cell sensor (not shown) is used during normal operation to detect the data state of the EPROM cell. EPROM cells like those depicted can be arranged in a grid of rows and columns to provide an array of EPROM cells for storing data bits.

As noted above, it can be desirable to reduce the size of the silicon semiconductor substrate of a fluid ejection device, such as by reducing its width or overall area. Advantageously, a reduced area fluid ejection die has been developed in which the EPROM memory cells are provided in a single array, or are divided into multiple discrete arrays, separated by some distance on the die. In one embodiment, two or more separate EPROM arrays are located on opposite ends of a long and narrow inkjet die.

Figure 2:
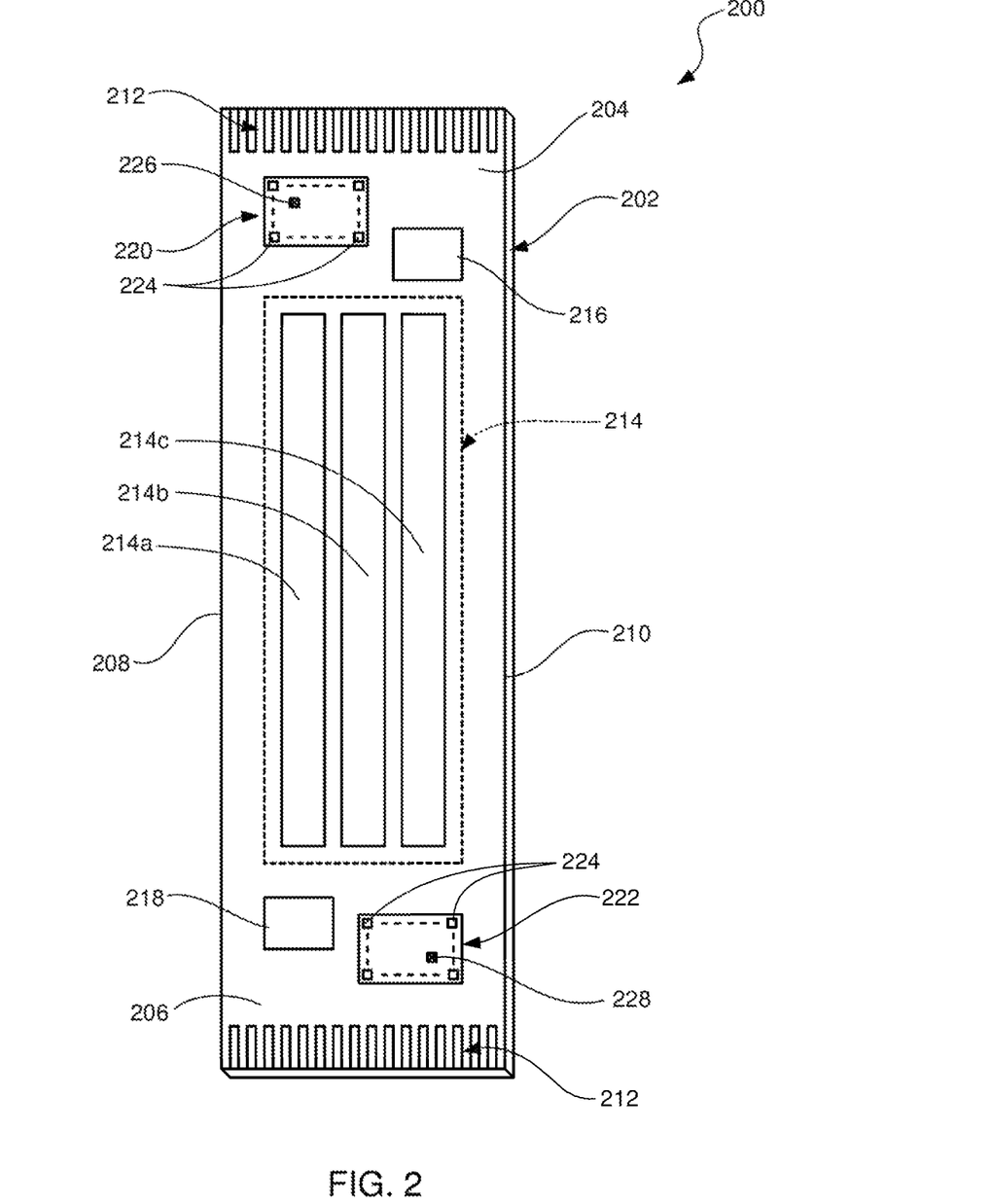
FIG. 2 is a plan view of an inkjet die having two separated EPROM arrays, each including a corresponding reference cell.

As shown by way of example in FIG. 2, one embodiment of an inkjet die 200 incorporating teachings of the present disclosure includes a single, elongated semiconductor substrate 202 having a first end 204, an opposed second end 206, and parallel side edges 208, 210 extending therebetween. The first end 204 and the second end 206 of the substrate 202 are each provided with a plurality of electrical contacts 212, by which electronic devices on the substrate 202 are coupled to other elements of a fluid jet printer system (not shown). An inkjet firing array 214 is embodied in the substrate 202 at a longitudinally central position, between the first end 204 and the second end 206 thereof, there occupying substantially all of the available area for devices between the side edges 208, 210.

The inkjet firing array 214 includes a plurality of firing nozzles (not shown) that are disposed generally in lengthwise alignment with the side edges 208, 210 of the substrate 202. Each firing nozzle is supplied with ink from the printer system with which the inkjet die 200 is employed. Where the inkjet die 200 is to function in a monochromatic printing system, such as a black-and-white printer, the ink can be of a single color of ink. Alternatively, where the inkjet firing array 214 is intended to serve in a color printing system, the inkjet firing array 214 can include a plurality of inkjet firing nozzle sub-arrays 214a, 214b and 214c, which are disposed in lengthwise alignment with the side edges 208, 210 of the substrate 202. Each of the inkjet firing nozzle sub-arrays 214a, 214b, 214c include a plurality to firing nozzles that are intended to be supplied from a color printing system with a respective, distinct color of ink.

Individual firing nozzles in the inkjet firing array 214 are controlled by electronic devices carried on the substrate 202 at each end of the inkjet firing array 214. For example, as shown in FIG. 2, these electronic devices can include a first address generator 216 at the first end 204 of the substrate 202 and a second address generator 218 at the second end 206. The first address generator 216 and second address generator 218 direct the firing of specific inkjet firing nozzles in inkjet firing array 214.

The electronic devices on the substrate 202 also include a first digital data storage array 220 at the first end 204 of the substrate 202 and a second digital data storage array 222 at the second end 206. It is to be appreciated that, while the embodiment of FIG. 2 depicts two data storage arrays separated by a distance, the principles of the present disclosure also apply to a die having only one data storage array, such as an EPROM array occupying a relatively large area, and to dies having more than two data storage arrays. Each of the first and second data storage arrays 220, 222, include a plurality of EPROM cells 224 that can be used to store digital data such as identification of the inkjet die, its date of manufacture, ink type, process parameters, nozzle spacing, and for other purposes. Additionally, successive reprogramming of these cells can be used, if desired, to control analog circuits, such as to create a variable time delay, or to track a number of pages printed out, for example. Those of skill in the art will appreciate that successive programming of EPROM cells in this way can involve variable voltage to allow adequate control in view of probable part variability.

The first digital data storage array 220 and the second digital data storage array 222 are located on the substrate 202 at a relatively substantial physical distance from each other on respective opposite sides of the inkjet firing nozzle array 214. It has been found that performance characteristics vary among EPROM cells that are fabricated on a single semiconductor die, and the performance variations generally increase with the physical distance between the cells. Consequently, with the configuration of FIG. 2, an undesirably large number of dies can fail to meet established performance standards at various stages of manufacture when multiple EPROM arrays are spatially separated. Similarly, an undesirably large number of dies can fail to meet established performance standards where a single EPROM array is provided.

Because of variations in manufacturing, EPROM cells in any given array can have performance characteristics that vary. Consequently, the EPROM cells 224 in the first digital data storage array 220 tend to exhibit performance characteristics that, as a group, are distinct from the performance characteristics of EPROM cells 224 in the second digital data storage array 222 as a group. Similarly, even where a single EPROM array is present, the performance characteristics of this array can vary as a group from a desired standard. This condition is an outgrowth of the manufacturing methods used to produce inkjet dies, and can cause an undesirable number of inkjet dies to fail to meet established performance standards at various stages of manufacture.

Advantageously, the teachings of the present disclosure help increase device yields in the manufacture of inkjet dies, such as an inkjet die 200. Specifically, a system and method have been developed for improving the yield of fluid ejection dies having multiple arrays of EPROM cells. In one embodiment, a single EPROM cell in each of the first and second EPROM arrays 220, 222 are designated as reference cells. That is, a first reference EPROM cell 226 is identified among the EPROM cells 224 in the first digital data storage array 220, and a second reference EPROM cell 228 is identified among the EPROM cells 224 in the second digital data storage array 222. As shown in FIG. 2, the reference cells can be physically located away from the edges of the respective array, such as being substantially in a central region of the array. This can contribute to the reference cells having performance characteristics that are substantially typical of performance characteristics of the cells in the array as a group.

Performance in EPROM cells is customarily measured in terms of the resistance R exhibited by the EPROM cell, resistance R being a reliable function of the amount of electrical charge that is stored on the floating gate of the EPROM cell. This resistance R of the reference cells can be used in at least two different ways to help recognize a greater number of dies that are suitable for use. In one embodiment, the resistance R of the reference cell in a given array is measured after fabrication, and this value becomes a performance standard against which to define logic-0 and logic-1 performances in all individual EPROM cells in that array, whether the die includes one array or several. Thus if the die includes a first EPROM array with a reference cell having measured resistance $R_1$, and a second EPROM array with a reference cell with measured resistance $R_2$, the resistance $R_1$ will become the performance standard $R_0$ (i.e. $R_0 = R_1$) for the first array, and $R_2$ will become the performance standard $R_0$ (i.e. $R_0 = R_2$) for the second array.

In another embodiment, where multiple EPROM arrays are present, the resistance R of the reference cells in each array are measured after fabrication, and then the resistance R of all the reference cells are averaged together to obtain a normalized resistance $R_0$ as a reference value for use with all arrays. Thus, if the performance value of the first reference EPROM cell 226 is designated as resistance $R_{226}$, and the performance value of second reference EPROM cell 228 is designated as resistance $R_{228}$ then:

$$R_0 = (R_{226} + R_{228})/2 \quad \text{(eq. 1)}$$

This quantity $R_0$ is an analog value that can be used with appropriate tolerance factors as a performance standard against which to define logic-0 and logic-1 performances in all individual EPROM cells in both arrays.

When the EPROM arrays are initially fabricated, each cell will have an initial logic zero state, having had no data written to it. Storing data values in each EPROM cell can be done once for an entire array, or a select number of cells can be written at any given point, each cell being written just once. The reference cell can be left with its initial logic zero state (i.e. not overwritten). After initially writing a data value (i.e. a logic-1 or logic-0) to some or all EPROM cells in each array, the resistance of the written EPROM cells in each array are then measured and compared against $R_0$ at several points in time, both during the manufacturing process and during use, as, for example, following die fabrication, after assembly with other components, and during actual use of the complete printing system. If the system detects a resistance value for a given cell that is outside the acceptable tolerance range for its particular logic state and for the point in time, this indicates a failure condition. However, because the reference resistance value $R_0$ represents either a representative cell from a given array or an average of reference cells from multiple EPROM arrays, this performance standard accounts for fabrication variations within a given array, or between multiple arrays, allowing more printhead dies to meet operational standards than otherwise. It is to be appreciated that, while two EPROM arrays are shown in FIG. 2 and discussed herein, this system and method can be generalized to one or any desired number of EPROM-cell arrays on a single die.

Figure 3:
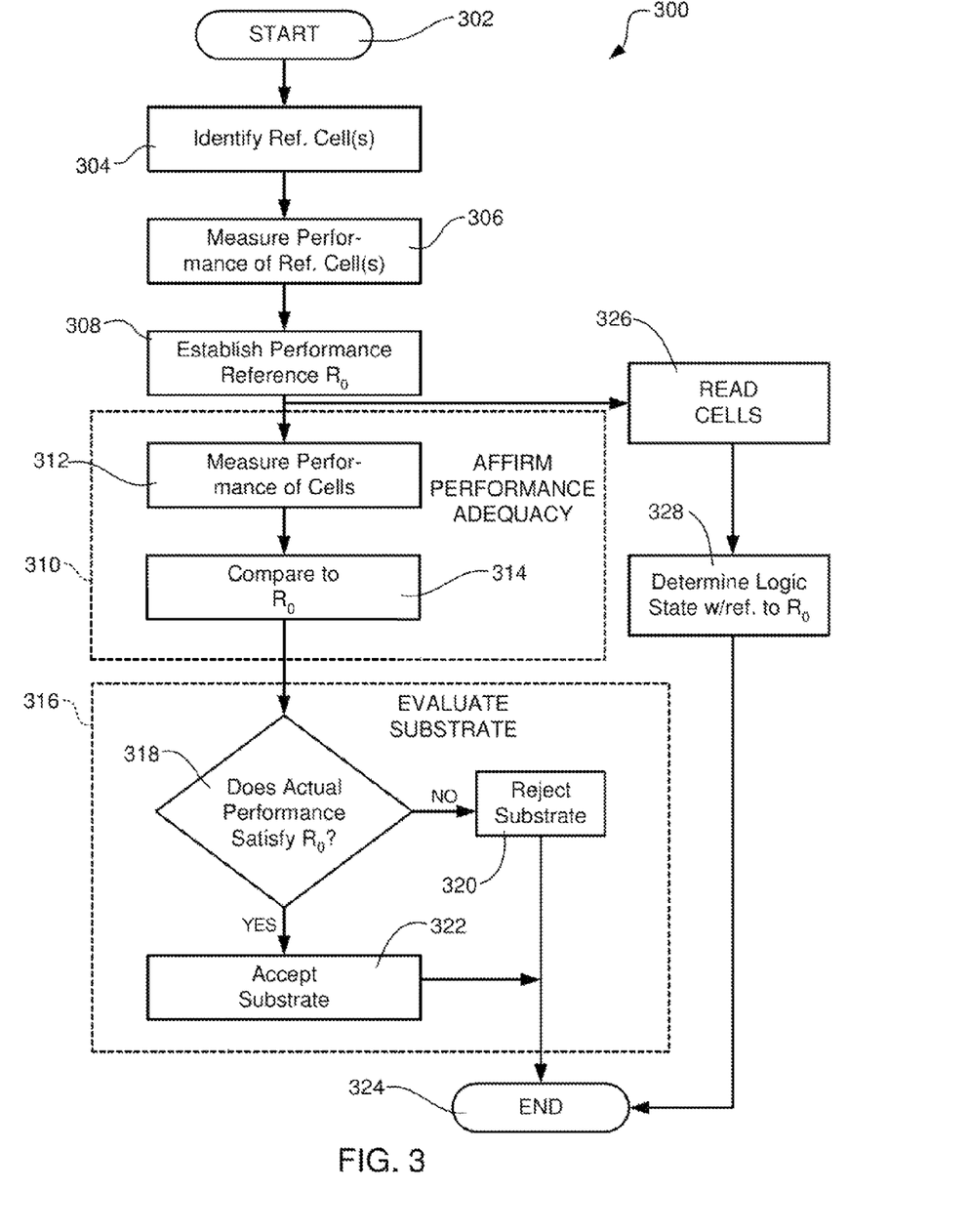
FIG. 3 is a flowchart outlining the steps in one embodiment of a method for affirming performance adequacy of EPROM cells in multiple separated arrays on a single substrate.

Shown in FIG. 3 is a flowchart of steps that can be performed in an embodiment 300 of a method for affirming the performance adequacy of EPROM cells in first and second arrays on a single substrate that is to perform as a fluid ejection device, such as an inkjet die for a print head. From a commencement balloon 302, the method 300 proceeds as indicated in instruction box 304 by identifying a corresponding first and second reference cell the first and second arrays, respectively, and then by measuring a selected performance criterion for each of the first and second reference cells, as indicated in instruction box 306. As indicated in instruction box 308, a performance reference value $R_0$ is then established. As discussed above, this reference criterion value $R_0$ can be the resistance of the reference cell in a given EPROM array. Alternatively, the measured performance criterion for the first and second reference cells can be averaged to obtain an averaged reference criterion value $R_0$.

Thereafter, the method 300 proceeds to a subroutine grouping 310 in which the actual performance of the cells on the substrate is evaluated against the reference criterion value $R_0$. The subroutine grouping 310 includes the step indicated in instruction box 312 of measuring the actual performance of cells on the substrate followed by the step indicated in instruction box 314 of comparing the measured performance of the cells on the substrate to a performance standard equal to or derived from the reference criterion value $R_0$. For example, a performance standard may be derived from the reference criterion value $R_0$ through multiplying the reference criterion value $R_0$ by one or various preselected tolerance factors. The step 312 of measuring the actual performance of the cells on the substrate includes measuring the actual performance of at least one cell. This can include measuring the performance of all cells on the substrate, or one or more subsets of all of the cells.

If the subroutine of evaluating 310 is undertaken during the fabrication of the substrate, the performance standard for logic-0 may be made to correspond to a measured performance that is less than the reference criterion value multiplied by a first fabrication tolerance factor, such as 1.15 $R_0$, while the performance standard for logic-1 may be made to correspond to a measured performance that is greater than or equal to the reference criterion value multiplied by a second fabrication tolerance factor that is greater than the first fabrication tolerance factor, such as 1.50 $R_0$.

On the other hand, if the subroutine of evaluating 310 is undertaken during assembly of the substrate into the inkjet print head, the performance standard for logic-0 may be made to correspond to a measured performance that is less than the reference criterion value $R_0$ multiplied by a first assembly tolerance factor, such as 1.15 $R_0$, while the performance standard for logic-1 may be made to correspond to a measured performance that is greater than or equal to the reference criterion value multiplied by a second assembly tolerance factor that is greater than the first assembly tolerance factor, such as 1.40 $R_0$.

It will be observed in the pair of examples set forth in the immediately preceding pair of paragraphs that the first fabrication tolerance factor is equal to the first assembly tolerance factor, and the second fabrication tolerance factor is greater than or equal to the second assembly tolerance factor. However, in those examples the first and second fabrication tolerance factors are distinct from each other, as are the first and second assembly tolerance factors. Nevertheless, it is to be appreciated that these tolerance factors are exemplary only, and other tolerance factors can be used during fabrication, assembly, and at other times.

The method for using the regional reference cells is slightly different during use of the assembled printing system. During actual use of a printing system employing an inkjet die manufactured and assembled according to teachings of the present disclosure, the performance standard for logic-0 may be made to correspond to measured performances that are less than the reference criterion value $R_0$ multiplied by a use tolerance factor, such as 1.25 $R_0$, while the performance standard for logic-1 may be made to correspond to measured performances that are greater than or equal to the reference criterion value multiplied by that same use tolerance factor. In other words, the logic-0 and logic-1 tolerance factors can be selected to provide no intermediate space therebetween, so that the value that is read from any cell will always return either a logic-0 or logic-1.

Additionally, during use of the printing system, there is no need to evaluate the substrate. All that is needed is to read the values that are stored in the memory cells. This is shown by box 326 in FIG. 3, which indicates the step of reading the value of one or more cells in the array during use of the printing system. Upon reading any of the cells, the system can determine the logic state of the cells with reference to $R_0$. The value of $R_0$ advantageously provides a standard for distinguishing logic-0 and logic-1 states when reading the memory elements in the array, and at the same time accommodates possible overall variation of the performance of the cells in a given array. That is, because the reference value $R_0$ can vary from one array to another, or from one semiconductor die to another, this allows the system to use a more representative threshold for distinguishing logic-0 and logic-1 states for a given memory array.

The fabrication and assembly portion of the method 300 concludes with a subroutine grouping 316 in which it is determined whether the substrate alone or the substrate in an assembly is acceptable for further or continued use. As indicated in decision diamond 318, it is desired that the measured performance of the cells on the substrate compare favorably to the appointed performance standard, whether that performance standard is equal to or derived from the reference criterion value $R_0$. If this condition is not met, then as indicated in instruction box 320, the substrate is rejected for further or continued use. On the other hand, if this condition is met, then as indicated in instruction box 322, the substrate is accepted for further or continued use. Method 300 then concludes in a termination balloon 324.

Figure 4:
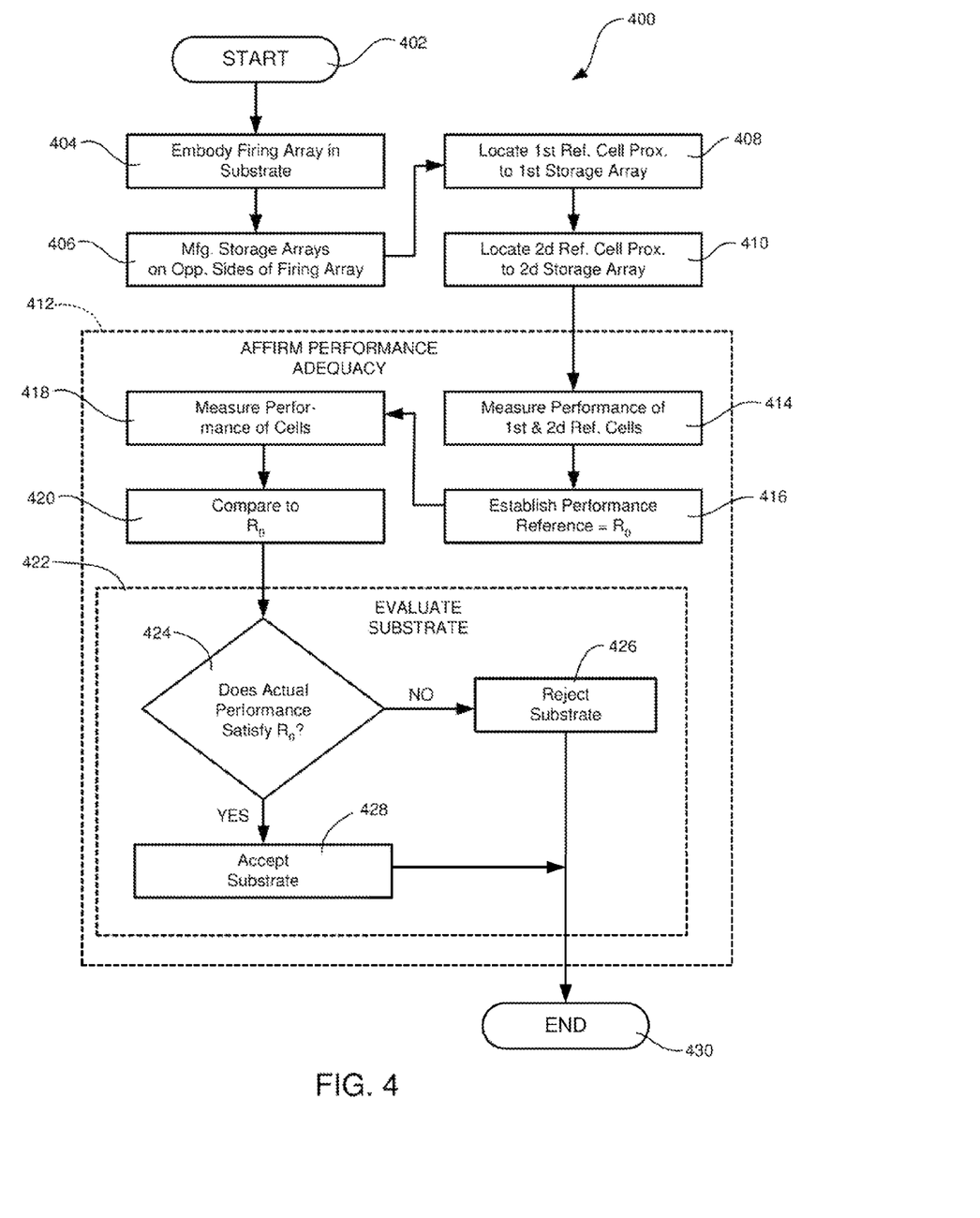
FIG. 4 is a flowchart outlining the steps in an embodiment of a method for manufacturing an inkjet die having EPROM cells in multiple, separated arrays on a single substrate.

FIG. 4 is a flowchart of typical steps performed in an embodiment of a method 400 for manufacturing an inkjet die for a print head. From a commencement balloon 402, the method 400 proceeds as indicated in instruction box 404 by embodying an inkjet firing array in a semiconductor substrate and manufacturing first and second digital data storage arrays in the substrate with the inkjet firing array therebetween, as indicated in instruction box 406. Each of the storage arrays is comprised of plural EPROM cells. As indicated in instruction box 408, a first EPROM reference cell is located in the substrate in close proximity to the first storage array, and a second EPROM reference cell is located in the substrate in close proximity to the second storage array, as indicated in instruction box 410.

Thereafter, the method 400 proceeds to a subroutine grouping 412 in which the performance adequacy of EPROM cells in the first and second arrays is affirmed. Subroutine grouping 412 includes the step of measuring a selected performance criterion for each of the first and second reference cells as indicated in instruction box 414 and, as indicated in instruction box 416, a performance reference criterion $R_0$ is established. As discussed above, establishing this reference criterion can involve designating the performance criterion that was measured for each reference cell as the reference criterion for the respective memory array. Alternatively, establishing this reference criterion can include the step of averaging the measured performance criterion for the first and second reference cells to obtain a reference criterion value, namely reference resistance value $R_0$, as discussed above with respect to FIG. 3. Then as indicated in instruction box 418, the method 400 continues with the step of measuring the actual performance of the cells on the substrate, followed by the step of comparing the measured performance of the cells on the substrate to a performance standard derived from the reference criterion value $R_0$, as indicated in instruction box 420. As discussed above, a performance standard may be derived from the reference criterion value $R_0$ through multiplying the reference criterion value $R_0$ by one of various preselected tolerance factors in any of the approaches described above in relation to FIG. 3. Additionally, as discussed above, the step of measuring the actual performance of the cells on the substrate includes measuring the actual performance of at least one cell. This can include measuring the performance of all cells on the substrate, or one or more subsets of all of the cells.

The method 400 concludes with a sub-subroutine grouping 422 in which it is determined whether the substrate alone or the substrate in an assembly is acceptable for further or continued use. As indicated in decision diamond 424, it is desired that the measured performance of the cells on the substrate compare favorably to the appointed performance standard, whether that performance standard is equal to or derived from the reference criterion value $R_0$. If this condition is not met, then as indicated in instruction box 426, the substrate is rejected for further or continued use. On the other hand, if this condition is met, then as indicated in instruction box 428, the substrate is accepted for further or continued use. The method 400 then concludes in a termination balloon 430.

The system and method disclosed herein provides a print head with EPROM cells distributed in one or more arrays on a single substrate, and a method for affirming performance adequacy of the EPROM cells. A single EPROM reference cell is designated in each array. The resistance R of each reference cell is measured at fabrication. These resistances R can be used with appropriate tolerance factors as a performance standard against which to define logic-0 and logic-1 performances for all cells in the respective array at established points during manufacture and use. Alternatively, the resistances from multiple arrays can be averaged to obtain a normalized resistance $R_0$, which is used with appropriate tolerance factors as the performance standard. If resistance R for any EPROM cell is outside the acceptable tolerance range for the particular logic state written therein, failure is indicated. By using a normalized performance standard for determining acceptable performance of the EPROM cells, the disclosed method accommodates for fabrication variations among and between the arrays, contributing to higher device yields.

It is to be understood that the above-referenced arrangements are illustrative of the application of the principles disclosed herein. It will be apparent to those of ordinary skill in the art that numerous modifications can be made without departing from the principles and concepts of this disclosure, as set forth in the claims.

What is claimed is:

1. A method for affirming performance adequacy of EPROM cells on a single substrate, comprising:
   (a) identifying a first reference cell in a first EPROM array on the substrate;
   (b) measuring a selected performance criterion for the first reference cell to obtain a reference criterion value; and
   (c) evaluating against the reference criterion value the actual performance of at least one cell in the first array.

2. A method as recited in claim 1, wherein the measured performance criterion for the first reference cell is an analog value of resistance reflective of an electrical charge stored in the first reference cell.

3. A method as recited in claim 2, wherein the actual performance of at least one cell in the first array is an analog value of resistance reflective of the charge stored in the at least one cell in the array.

4. A method as recited in claim 1, wherein the step of evaluating comprises:
   (a) measuring the actual performance of at least one cell in the first array; and
   (b) comparing the measured performance of the at least one cell in the first array to a performance standard derived from the reference criterion value.

5. A method as recited in claim 4, further comprising accepting the substrate, when the measured performance of the at least one EPROM cell on the substrate compares favorably to the reference criterion value.

6. A method as recited in claim 5, wherein the performance standard equals the reference criterion value multiplied by a preselected tolerance factor.

7. A method as recited in claim 4, wherein:
   (a) the step of evaluating is undertaken during fabrication of the substrate;

(b) the performance standard for logic-0 corresponds to a measured performance less than the reference criterion value multiplied by a first fabrication tolerance factor; and
(c) the performance standard for logic-1 corresponds to a measured performance greater than or equal to the reference criterion value multiplied by a second fabrication tolerance factor greater than the first fabrication tolerance factor.

8. A method as recited in claim 7, wherein:
(a) the step of evaluating is undertaken during assembly of the substrate into a fluid ejection device;
(b) the performance standard for logic-0 corresponds to a measured performance less than the reference criterion value multiplied by a first assembly tolerance factor; and
(c) the performance standard for logic-1 corresponds to a measured performance greater than or equal to the reference criterion value multiplied by a second assembly tolerance factor greater than the first assembly tolerance factor.

9. A method as recited in claim 8, wherein:
(a) the first fabrication tolerance factor is equal to the first assembly tolerance factor; and
(b) the second fabrication tolerance factor is greater than or equal to the second assembly tolerance factor.

10. A method as recited in claim 1, further comprising:
(a) identifying a second reference cell in a second array on the substrate;
(b) measuring the selected performance criterion for the second reference cell;
(c) averaging the selected performance criterion for the first and second reference cells to obtain a reference criterion value; and
(d) evaluating against the reference criterion value the actual performance of at least one cell in the first and second arrays.

* * * * *